Dec. 12, 1967 S. W. ING, JR., ETAL 3,358,146

INTEGRALLY CONSTRUCTED SOLID STATE LIGHT EMISSIVE-LIGHT RESPONSIVE NEGATIVE RESISTANCE DEVICE

Filed April 29, 1964

INVENTORS:
SAMUEL W. ING, JR.
HAROLD A. JENSEN,

BY Marvin D. Goldenberg
THEIR ATTORNEY.

United States Patent Office 3,358,146
Patented Dec. 12, 1967

3,358,146

INTEGRALLY CONSTRUCTED SOLID STATE LIGHT EMISSIVE-LIGHT RESPONSIVE NEGATIVE RESISTANCE DEVICE

Samuel W. Ing, Jr., Manlius, and Harold A. Jensen, Liverpool, N.Y., assignors to General Electric Company, a corporation of New York Filed Apr. 29, 1964, Ser. No. 363,553
10 Claims. (Cl. 250—213)

ABSTRACT OF THE DISCLOSURE

A solid state device of negative resistance characteristic exhibiting electrical isolation and efficient optical coupling between input and output for use as switching element wherein a light emitting p-n junction diode is formed integral with a semi-insulating body at one portion thereof and a photosensitive negative resistance p-si-n diode is formed integral with said semi-insulating body at a second portion thereof so that light emitted by said p-n junction diode in response to an electrical input signal is efficiently coupled to said p-si-n diode for switching its impedance state and thereby effecting a change in electrical output signal.

The invention relates to solid state devices of the type that exhibit a light responsive, negative resistance characteristic. More particularly, the invention relates to the novel, integral construction of a device as described which includes a light emissive element and a photosensitive, negative resistance element wherein there is provided efficient coupling of light energy for controlling the impedance of said photosensitive element.

In recent years, there have been developed a number of solid state, negative resistance devices in the form of p-si-n diodes which exhibit a high forward impedance at applied potentials below a given threshold level, the impedance abruptly decreasing upon said threshold level being exceeded. Accordingly, these devices exhibit an S-type negative resistance, which term is derived from the V–I characteristic of the device. The si (semi-insulating) region of the device is normally composed of a single crystal semiconductor material, e.g. GaAs, Ge or Si, that has had added to it a deep level impurity dopant, e.g., copper to GaAs and Ge, and gold to Si. The added dopant transforms the crystal in a semi-insulating material, providing a normal resistivity of about $10^3$ to $10^8$ ohm-cm. in GaAs, 100 to $10^4$ ohm-cm. in Si and 40 to 60 ohm-cm. in Ge. For purposes of the instant invention, a semi-insulating material is considered as one exhibiting double injection and characterized by an ability to be switched between a high and low impedance state. It may have a normal resistivity in the range of 40 to $10^{12}$ ohm-cm.

Briefly, the action of the p-si-n diodes in a physical concept may be described as follows: The deep level impurity dopant produces electron-hole recombination centers in the forbidden band of the material between the valence band and the conduction band. These recombination centers are totally or partially filled with electrons. The hole capture cross section $\sigma_p$ of these centers is considerably larger than the electron capture cross section $\sigma_n$. When a voltage below a threshold voltage $V_{th}$ is applied so as to inject electrons and holes into the si region, the injected holes swiftly recombine with the electrons in the recombination centers, hole lifetime being low, and they cannot measurably contribute to the current. Hence, only a small electron current flows and the impedance is relatively high. As the critical threshold voltage level is exceeded, the hole transit time across the si region becomes on the order of the low level hole lifetime. This begins the negative resistance region of the V–I characteristic and is the onset of the semiconductor regime. The recombination centers now tend to be emptied of electrons so that the hole recombination rate decreases and lifetime increases. As more current is applied, this phenomenon sweeps across the si region and in effect converts the semi-insulating region into a semiconductor region with both holes and electrons contributing to current flow. A minimum voltage $V_{min}$ is reached after which the diode again exhibits positive resistance but now at a low impedance level, typically more than an order of magnitude less than the high level impedance.

These devices normally exhibit a photosensitive property so that in response to light energy of suitable wavelength the level of potential at which the impedance abruptly changes is less than the normal threshold level. Many devices have been found to be sufficiently photosensitive so that a considerable difference in switching potential is exhibited, as a function of the light intensity. Accordingly, this property is useful for numerous switching applications. In practice, a bias potential is applied to the diode, which is less than $V_{th}$ but greater than the potential required for switching in the presence of light. In the absence of coupled light the diode presents a high impedance and switches to its low impedance state upon the triggering of a coupled light source.

Of advantage in switching applications of various kinds, including the computer as well as the power fields, p-si-n diodes can be made small, light, compact. They have relatively good speed of operation on the order of microseconds, can be used for high power purposes and have good high temperature characteristics.

For further discussions with respect to these diodes, reference is made to an article by Ing, Jr., et al., entitled, "Double Injection with Negative Resistance in Semi-Insulators," appearing in the Physical Review Letters, vol. 8, No. 11, June 8, 1962, and a further article by N. Holonyak, Jr., entitled, "Double Injection Diodes and Related DI Phenomena in Semiconductors," appearing in the Proceedings of the IRE, vol. 50, No. 12, December 1962.

In the use of the above described photosensitive diodes, conventional small light sources have been employed for controlling the diode impedance state, such as GaAs p-n diodes. The light sources are placed proximate to the light responsive p-si-n diodes, normally with an intervening air or gas medium of optical characteristics incompatible with the solid state components. Accordingly, there has been lacking an efficient means for coupling light energy to the p-si-n diodes which places stringent requirements in fabricating the p-si-n diodes and light emissive elements so as to provide adequate photosensitivity and light energy. The present invention very appreciably improves the light coupling efficiency possible between light source and receptor and adds measurably to the useful application of the p-si-n diode.

It is accordingly a primary object of the invention to provide a novel solid state device having a light responsive negative resistance characteristic, constructed so that an efficient light energy coupling is accomplished.

It is another object of the invention to provide a novel unitary construction of a solid state device including a light emitting element in combination with a photosensitive, negative resistance element wherein there is an efficient coupling of light energy between said elements.

It is a further object of the invention to provide a device as above described wherein the photosensitive element is a p-si-n diode.

These and other objects of the invention are accomplished in accordance with a basic embodiment of the invention in a solid state device of unitary construction which includes a wafer body of si material. Integral with one portion of said si body is formed a light emitting element, typically a p-n junction diode. Integral with another portion of the si body is formed a light responsive, negative resistance p-si-n diode, said p-si-n diode being situated in the path of light emitted by said p-n diode and responsive to the wavelength of the emitted light. The continuous medium extending between the light emitting junction of the p-n diode and the photosensitive si region of the p-si-n diode has suitable optical properties for providing efficient light transmission. A potential is applied across said p-si-n diode having a magnitude below the diode threshold level so that in the absence of light coupled to the p-si-n diode, the diode is in its high impedance state. Upon triggering the p-n diode, the resulting light energy coupled to the p-si-n diode causes said diode to abruptly switch to its low impedance state.

In accordance with a further aspect of the invention, a fan-out arrangement may be provided wherein a plurality of light responsive p-si-n diodes are radiantly coupled to a single light emitting element in a single unitary construction wherein the light emitting element is employed to control any one or all of the light responsive diodes.

With respect to still a further aspect of the invention, a fan-in arrangement may be provided wherein there are supplied a plurality of light emitting elements radiantly coupled to a single light responsive p-si-n diode in a single unitary construction wherein any one or all of the light emitting elements accomplish a control function with respect to the light responsive diode.

While the specification concludes with claims particularly pointing out and distinctly claiming the invention, it is believed that the invention will be better understood from the following description taken in connection with the accompanying drawings in which:

Figures 1, 2, 3, 4:
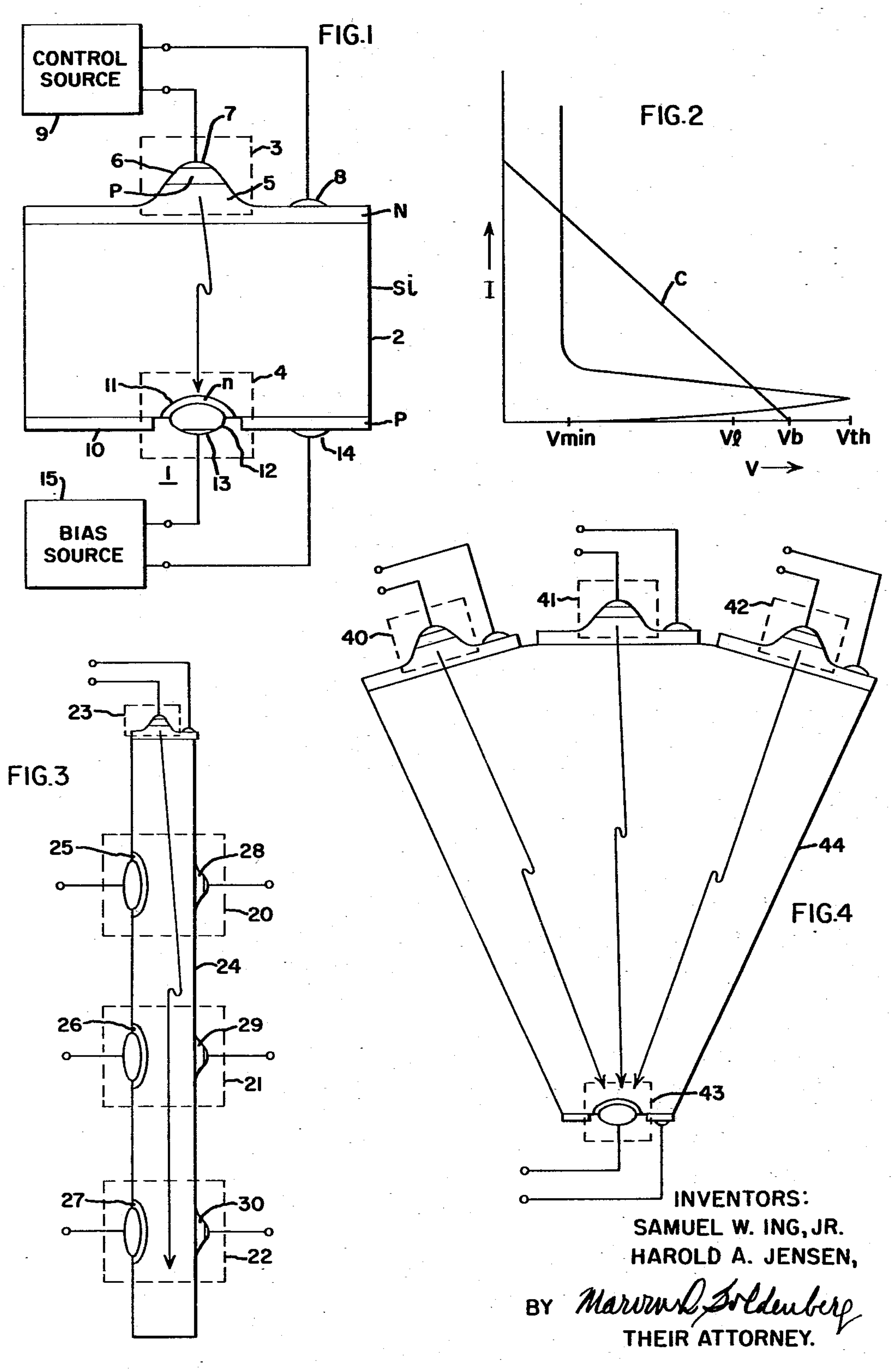
FIGURE 1 is a schematic diagram of a solid state device of integral construction, in accordance with the invention.
FIGURE 2 is a V–I characteristic of the p-si-n diode element of FIGURE 1.
FIGURE 3 is a schematic diagram of a solid state device of integral construction, in accordance with the invention, having a fan-out characteristic.
FIGURE 4 is a schematic diagram of a solid state device of integral construction, in accordance with the invention, having a fan-in characteristic.

Referring now to FIGURE 1 there is illustrated an integrally constructed solid state device 1 which includes a semi-insulating crystal wafer 2 on one end of which is formed a light emitting p-n diode 3 and on the other end of which is formed a light responsive p-si-n diode 4. The semi-insulating material from which the wafer 2 is fabricated is typically gallium arsenide (GaAs), but can be numerous other doped semi-conductor compositions that are substantially transparent to the emitted light.

In the construction being considered, the light emitting p-n diode 3 includes an n region 5 which is grown on the si crystal 2 and is of the same material as the crystal 2, e.g., GaAs with a tin dopant. The p region 6 of the diode 3 is zinc diffused into the n-type grown layer. A first ohmic contact 7 of diode 3 is made to the p-region 6 and a second ohmic contact 8 is made to the n region 5. A potential source 9, typically providing trigger pulses, is coupled to the ohmic contacts 7 and 8 for energizing diode 5 and causing light to be controllably emitted from the diode junction, in accordance with established theory. It is seen that the p and n regions 6 and 5 have been etched away so as to limit the junction dimension and thereby confine the light emitted therefrom. It is noted that although the p and n regions of the diode 3 can be inverted so that the p region is contiguous to the si region, in practice the described configuration is normally preferable since n regions commonly have superior light transmitting properties as compared to p regions.

The p-si-n diode 4 includes a p diffused region 10, which may be formed similarly to the p region of p-n diode 3, and an n region 11. The n region 11 is formed by an alloying process wherein a metal pellet 12, such as tin, is applied to the surface of the wafer 2 and upon successive heating and cooling forms the n region. A first ohmic contact 13 of diode 4 is made to the pellet 12 and a second ohmic contact 14 is made to p region 10. A source 15 of potential is coupled by means of the ohmic contacts across the p-si-n diode. In the operation of the diode, the source 15 can be operated to provide a DC bias voltage or pulses for setting and resetting the diode.

The p-si-n diode 4 is located and arranged with respect to the p-n diode 3 so as to be in the path of light energy emitted from the diode 3. It is seen that one continuous medium of a given material, in this instance GaAs, extends from the light emitting junction of p-n diode 3 to the si region of p-si-n diode 4 whereby a very efficient light coupling is possible. In the indicated construction a flexibility exists in establishing the medium through which the light energy is transmitted for providing optimum optical characteristics in a given application. Thus, in the indicated use of GaAs, the refractive index is essentially uniform throughout the light transmission medium. However, the absorption coefficient of GaAs to light generated by this material is higher than, for example, that of high energy band gap materials, such as gallium phosphide (GaP). Therefore, another desirable arrangement is a GaP wafer having a GaAs light emitting diode and p-si-n diode formed thereon. The refractive indexes of GaAs and GaP are closely matched. Still other material combinations may be used which would provide an effective light coupling.

The dimension of the wafer 2 in the direction extending between diodes 3 and 4 should be great enough so as to provide electrical isolation between the diodes, which is desirable for most operations. The thickness dimension, however, should not be excessive so as to unduly attenuate the transmitted light. In the example being considered the wafer has a thickness of several mills. The width and length is on the order of a few millimeters, primarily for mechanical considerations.

The mean path length through the si region of diode 4, i.e., between the p region 10 and the n region 11, must be greater than a few diffusion lengths for holes at high impedance levels in order that the diode exhibit a negative resistance characteristic.

Considering the operation of the device of FIGURE 1, the source 15 applies a bias potential $V_b$, shown in FIGURE 2, across diode 4 of a magnitude less than the diode threshold level $V_{th}$ and greater than the level $V_1$, which is required for switching the diode in the presence of applied light. The magnitude of $V_1$ may be appreciated to vary in accordance with the intensity of the applied light as well as the physical characteristics of the diode 4. For a given load, indicated by load line C in FIGURE 2, the current is relatively low or, otherwise stated, the impedance is high, until the threshold $V_{th}$ is reached. The load, not shown in FIGURE 1, would normally be placed either in series between the source 15 and the diode 4, or in parallel therewith. Upon exceeding $V_{th}$, it is seen that the diode switches to its low impedance state at $V_{min}$, the switching occurring through a negative resistance state with great rapidity.

Accordingly, with the bias voltage at $V_b$ and in the absence of light coupled to the diode, the diode is in its high impedance state. If the diode is being used in a switching application, the switch may be considered to be open. Since $V_b$ is greater than $V_1$, upon the energization of light emitting diode 3 and the subsequent transmission of light energy to diode 4, the diode 4 switches to its low impedance state and the switch is closed. The photosensitive diode 4 has a storage function in that upon being irradiated with a short light energy burst, only sufficiently long to cause switching to the low impedance state, the diode will remain in its low impedance state until the voltage applied to it is reduced below $V_{min}$, as by application of a negative resetting pulse.

In an exemplary operation of the device for a given load, $V_{th}$ is about 15 volts at room temperature, with a current of 3 ma., and $V_{min}$ is about 5 volts, with a current of 25 ma.

It should be noted that although a specific example has been presented with reference to the device of FIGURE 1, no limitation with respect to means and processes for forming the recited semiconductor light emitting element and p-si-n diode is intended. Thus, other well known and conventional techniques may be readily employed for forming these components.

In FIGURE 3, there is shown an integrally constructed solid state device including a plurality of three light sensitive p-si-n diodes 20, 21, 22 and a single light emitting p-n diode 23. Radiation from diode 23 is coupled commonly to each of the light sensitive diodes 20–22 to provide a fan-out characteristic. A wafer 24 of si material, similar to the wafer 2 of FIGURE 1, is included on which the diodes are formed and which acts as a light conductor. The dimensions and configuration of the wafer are modified from that shown in FIGURE 1, as will be explained. Diodes 20–22 extend across the narrow dimension of the wafer 24. Thus, on one long side of the wafer 24 are formed, as by an alloying process, the n regions 25, 26 and 27, respectively, of diodes 20–22. On the opposite long side of wafer 24 are formed, as by diffusion, their p regions 28, 29 and 30, respectively. The p-n diode 23, which may be identical to the diode 3 of FIGURE 1 is formed on one of the narrow dimension sides extending at right angle to the long sides of si wafer 24. Appropriate bias potential sources are applied to the ohmic contacts of the p-si-n diodes and a control potential source to the p-n diode, these sources not being shown in FIGURE 3. In order to maintain electrical isolation between the p-si-n diodes 20–22, the distance between diodes along the long dimension of the wafer 24 should be greater than the distance across the narrow dimension of the wafer in the si region.

In the operation of the device of FIGURE 3, bias potentials are applied to photosensitive diodes 20–22 to set them in their high impedance state ready for switching. Depending upon the application considered, the bias potentials may be applied on a selective or a non-selective basis. In response to the coupling of light to diodes 20–22 from light emitting diode 23, those of diodes having bias potentials applied are switched to their low impedance state and remain there until reset.

With reference to FIGURE 4, a plurality of light emitting elements, shown as p-n diodes 40, 41 and 42, are associated in an integral construction with a single light responsive p-si-n diode 43. The device is constructed so that light emitted from each of the p-n diodes 40–42 is coupled to p-si-n diode 43 whereby any one or all of diodes 40–42 are used for controlling the impedance state of diode 43, providing a fan-in characteristic.

Diodes 40–42 are formed on one side of a tapered si wafer 44 in a line fashion. Diode 43 is formed on the narrow side opposite the light emitting diodes. Diodes 40–42 are each formed similarly to diode 3 of FIGURE 1, and diode 43 corresponds to diode 4 of FIGURE 1. The diodes 40–42 should be separated sufficiently so that they are electrically isolated from one another.

In one operation of the device of FIGURE 4, a bias potential is applied to the light responsive p-si-n diode 43. In response to the energization of any one of diodes 40–42, which applies light to diode 43, diode 43 switches to its low impedance state.

In an alternative operation, the intensity of light emitted from a single p-n diode may be insufficient to cause the p-si-n diode 43 to switch, and energization of either two out of three or all three of diodes 40–42 may be required in order to switch the impedance state of diode 43.

It may be appreciated that numerous modifications may be made to the specifically described and illustrated devices of FIGURES 3 and 4 without exceeding the teaching herein provided. Thus, the geometry of these devices may be varied from that specifically illustrated. In addition, the light emitting and light responsive elements may be modified somewhat from that described. These and other modifications falling within the basic invention herein set forth are intended to be included within the scope of the appended claims.

What we claim as new and desire to secure by Letters Patent of the United States is:

1. A solid state device comprising:
(a) a semi-insulating body,
(b) a light emitting element formed integral with a portion of said semi-insulating body,
(c) a photosensitive negative resistance p-si-n diode formed integral with a second portion of said semi-insulating body so that the si region of said diode is common to said semi-insulating body,
(d) said element and said diode being in a radiantly coupled relationship and constructed and arranged so that a continuous solid medium extends between the light emitting element and the photosensitive diode, whereby light emitted from said element is efficiently coupled to said diode for controlling its impedance state.

2. A solid state device as in claim 1 wherein said element and said semi-insulating body are composed of material exhibiting compatible optical characteristics for providing optimum light coupling.

3. A solid state device comprising:
(a) a semi-insulating body,
(b) a light emitting p-n junction diode formed on one side of said semi-insulating body,
(c) a photosensitive negative resistance p-si-n diode formed on a second side of said semi-insulating body opposite said one side so that the si region of said diode is common to said semi-insulating body,
(d) said diodes being in a radiantly coupled relationship and constructed and arranged so that a continuous solid medium of approximately matching refractive indexes extends between the light emitting diode and the photosensitive diode, whereby light emitted from said light emitting diode is efficiently coupled to said p-si-n diode for controlling its impedance state.

4. A solid state device comprising:
(a) a semi-insulating body,
(b) a light emitting element formed integral with a portion of said semi-insulating body,
(c) a photosensitive negative resistance p-si-n diode formed integral with a second portion of said semi-insulating body so that the si region of said diode is common to said semi-insulating body,
(d) said element and said diode being in a radiantly coupled relationship and constructed and arranged so that a continuous solid medium extends between the light emitting element and the photosensitive diode,
(e) means for forward biasing said p-si-n diode at a level below threshold so that said diode is in a normally high impedance state, and
(f) means for energizing said light emitting element whereupon light emitted therefrom is efficiently coupled to said p-si-n diode for switching it to a low impedance state.

5. A solid state device comprising:
(a) a semi-insulating body,
(b) a light emitting element formed integral with a portion of said semi-insulating body,
(c) a plurality of photosensitive negative resistance p-si-n diodes integrally formed with other individual portions of said semi-insulating body so that the si region of said diodes is common to said semi-insulating body, (d) said element and said diodes being in a radiantly coupled relationship and constructed and arranged so that a continuous solid medium extends between the light emitting elements and the photosensitive diodes, whereby light emitted from said element is efficiently coupled to said diodes for controlling their impedance states.

6. A solid state device comprising:

(a) a semi-insulating body, (b) a light emitting element formed integral with a portion of said semi-insulating body, (c) a plurality of photosensitive negative resistance p-si-n diodes integrally formed with other individual portions of said semi-insulating body so that the si region of said diodes is common to said semi-insulating body, (d) said element and said diodes being in a radiantly coupled relationship and constructed and arranged so that a continuous solid medium extends between the light emitting elements and the photosensitive diodes, (e) means for selectively forward biasing said p-si-n diodes at a level below threshold, the biased diodes being in their normally high impedance state, and (f) means for energizing said light emitting element whereupon light emitted therefrom is efficiently coupled to said p-si-n diodes for switching those diodes having a bias applied to a low impedance state.

7. A solid state device comprising:

(a) a wafer shaped semi-insulating body, (b) a light emitting diode formed on one narrow dimensioned side of said semi-insulating body, (c) a plurality of photosensitive negative resistance p-si-n diodes formed between the wide dimensioned sides of said body which extend approximately orthogonal to said narrow dimensioned side so as to each be radiantly coupled to said light emitting diode, (d) said diodes being constructed and arranged so that a continuous solid medium extends between the light emitting diode and the photosensiive diodes, (e) means for selectively forward biasing said p-si-n diodes at a level below threshold, the biased diodes being in their normally high impedance state, and (f) means for energizing said light emitting diode whereupon light emitted therefrom is efficiently coupled to said p-si-n diodes for switching those diodes having a bias applied to a low impedance state.

8. A solid state device as in claim 7 wherein said photosensitive negative resistance p-si-n diodes are sufficiently spaced apart so as to provide electrical isolation therebetween.

9. A solid state device comprising:

(a) a semi-insulating body, (b) a plurality of light emitting elements integrally formed with individual portions of said semi-insulating body, (c) a photosensitive negative resistance p-si-n diode formed integral with a further portion of said semi-insulating body so that the si region of said diode is common to said semi-insulating body, (d) said elements and said diode being in a radiantly coupled relationship and constructed and arranged so that a continuous solid medium extends between the light emitting elements and the photosensitive diode, (e) means for forward biasing said p-si-n diode at a level below threshold so that said diode is in a normally high impedance state, and (f) means for selectively energizing said light emitting elements whereupon light emitted from the energized elements is efficiently coupled to said p-si-n diodes for selectively switching it to a low impedance state.

10. A solid state device as in claim 9 wherein said semi-insulating body is a tapered wafer having the said light emitting elements formed on a broad dimensioned side thereof and said p-si-n diode formed on an opposite narrow dimensioned side.

References Cited

UNITED STATES PATENTS

| | | | |
|---|---|---|---|
| 2,863,056 | 12/1958 | Pankove | 250—211 |
| 3,043,958 | 7/1962 | Diemer | 250—221 |
| 3,043,959 | 7/1962 | Diemer | 250—221 |
| 3,096,442 | 7/1963 | Stewart | 307—88.5 |
| 3,229,104 | 1/1966 | Rutz | 250—217 |
| 3,278,814 | 10/1966 | Rutz | 317—235 |
| 3,283,160 | 11/1966 | Levitt et al. | 250—213 |

ARCHIE R. BORCHELT, *Primary Examiner.*

RALPH G. NILSON, *Examiner.*

M. A. LEAVITT, *Assistant Examiner.*